US007016796B2

(12) United States Patent
Damle et al.

(10) Patent No.: US 7,016,796 B2
(45) Date of Patent: Mar. 21, 2006

(54) FAST AND ACCURATE AC RMS AND DC MEASUREMENT

(75) Inventors: Bakul Damle, Frisco, TX (US); Christopher G. Regier, Cedar Park, TX (US); Scott Borisch, Austin, TX (US)

(73) Assignee: National Instruments Corporation, Austin, TX (US)

( * ) Notice: Subject to any disclaimer, the term of this patent is extended or adjusted under 35 U.S.C. 154(b) by 243 days.

(21) Appl. No.: 10/452,743

(22) Filed: Jun. 2, 2003

(65) Prior Publication Data

US 2004/0034512 A1 Feb. 19, 2004

Related U.S. Application Data

(60) Provisional application No. 60/403,334, filed on Aug. 14, 2002.

(51) Int. Cl.
*G06F 15/00* (2006.01)
(52) U.S. Cl. .......................... 702/66; 702/70; 702/190; 702/198
(58) Field of Classification Search ................ 324/119; 702/189, 190, 198, 66–67, 70
See application file for complete search history.

(56) References Cited

U.S. PATENT DOCUMENTS

| | | | |
|---|---|---|---|
| 5,117,180 A | | 5/1992 | Swerlein |
| 5,446,371 A | * | 8/1995 | Eccleston et al. ........ 324/121 R |
| 5,933,013 A | * | 8/1999 | Kimura ...................... 324/601 |
| 6,469,492 B1 | | 10/2002 | Britz |
| 6,516,279 B1 | | 2/2003 | Jansen et al. |
| 6,628,113 B1 | * | 9/2003 | Gallavan ..................... 324/102 |
| 6,789,030 B1 | * | 9/2004 | Coyle et al. .................. 702/77 |
| 2002/0180419 A1 | * | 12/2002 | Britz .......................... 324/119 |

* cited by examiner

*Primary Examiner*—Marc S. Hoff
*Assistant Examiner*—Paul Kim
(74) *Attorney, Agent, or Firm*—Meyertons Hood Kivlin Kowert & Goetzel, P.C.; Jeffrey C. Hood; Martin R. Wojcik

(57) ABSTRACT

A small microcontroller or a DSP may be used to process digital signals representative of a measurement. Furthermore, special RMS AC measurement or DC noise rejection algorithms may have to be run on the microcontroller or the DSP. Other implementations may use custom digital logic, such as FPGAs, to process the digital signals. The DSP may not have enough capacity to store and process all data at the same time. Certain physical limitations are inherent to the DSP architectures, such as the trade-off of on-board memory size vs. speed, power consumption, and physical chip size. As a result, the RMS AC Measurement and the DC Noise rejection algorithms enable computational devices such as DSP's to perform sophisticated and accurate RMS measurements for waveforms ranging from DC to high frequency. The RMS AC Measurement and the DC Noise rejection algorithms uses on the on-the-fly computation of interpolated window values. As a result, the RMS AC Measurement and the DC Noise rejection algorithms can use any window, rather than being constrained to computationally efficient $sinc^N$ windows.

47 Claims, 7 Drawing Sheets

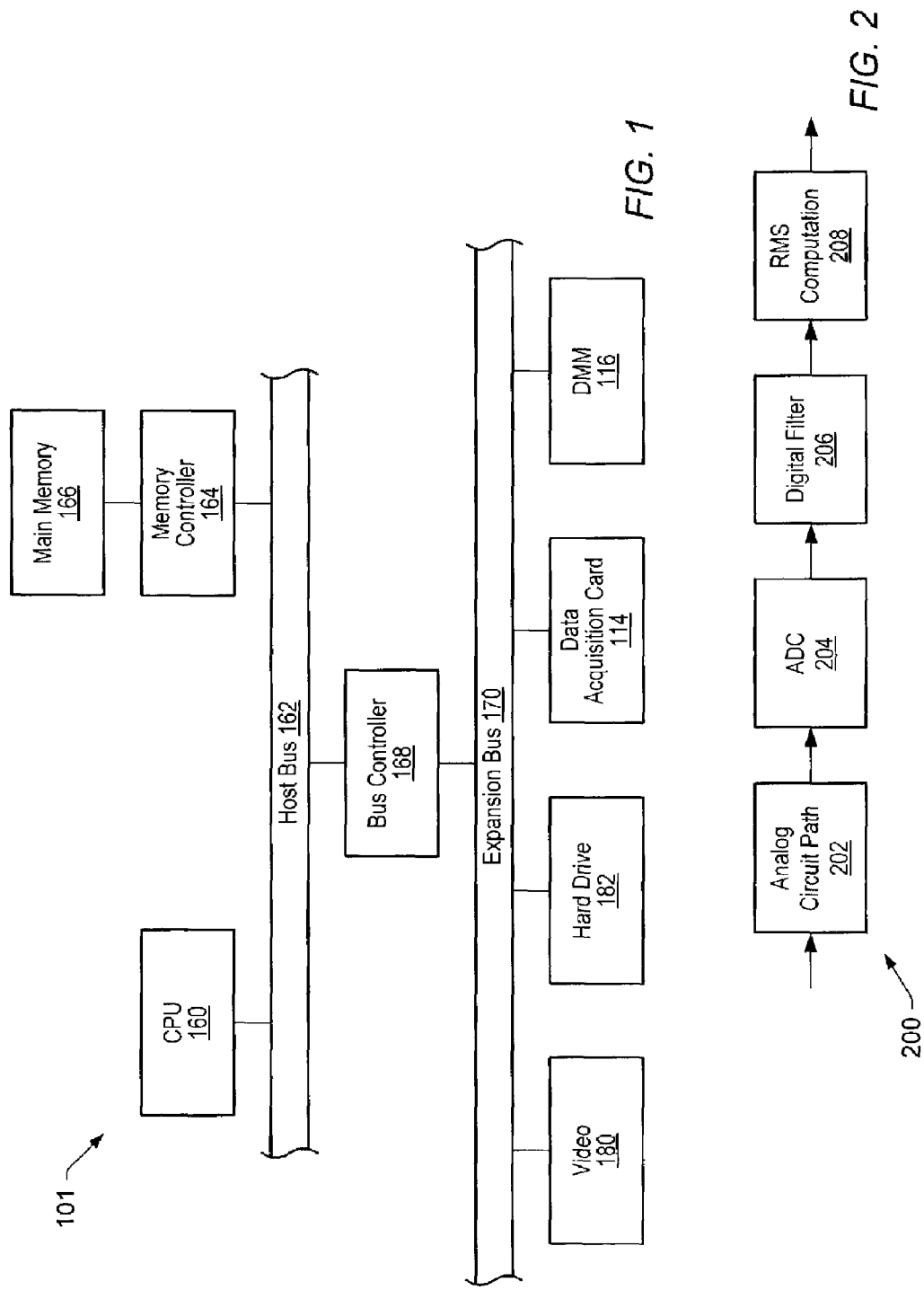

- ● Input waveform
- ▲ Window points stored on-board
- ■ Interpolated window points
- + Processed waveform (after window is applied)

FAST AND ACCURATE AC RMS AND DC MEASUREMENT

PRIORITY CLAIM

This application claims benefit of priority of U.S. provisional application Ser. No. 60/403,334 titled "Fast and Accurate AC and DC RMS Measurement" filed Aug. 14, 2002, whose inventors were Bakul Damle, Christopher G. Regier, and Scott Borisch.

FIELD OF THE INVENTION

The present invention relates to the field of computer-based test systems, and more particularly to a system and method for making sophisticated and accurate RMS measurements for waveforms ranging from DC to a high frequency.

DESCRIPTION OF RELATED ART

Standard practice has taken one of two approaches for digital measurement and calculation of RMS value of a signal, either acquire an integer number of waveform cycles (making windowing unnecessary) or randomize a sample clock so the signal appears as noise. It would be advantageous to use a DMM for digital AC computation using windows, thus gaining accuracy and speed. In addition, use of interpolated windows may minimize the amount of memory needed for computations.

Many off-the-shelf sigma-delta ADCs use something other than straight averaging for DC computation. However, it would be advantageous to offer a user-selectable window, as well as an ability to use interpolation to generate window values.

SUMMARY OF THE INVENTION

A measurement device such as a DMM may include four basic units—an analog circuit path, an analog to digital converter (ADC), a digital filter, and an RMS computation unit. The measurement device may include a plurality of channels, where each channel may have one or more modes. The four basic units may be operable to multiplex or to process one or more of the plurality of channels at the same time.

The analog circuit path may include the necessary circuitry for the plurality of channels to couple to one or more analog signals. The analog circuit path may include one or more of an analog interface, analog signal conditioning, voltage isolation units, multiplexers, and analog filters, besides others. The analog circuit path may couple to the ADC. The ADC may be operable to receive the one or more analog signals from the analog circuit path and convert it to one or more digital signals.

A small microcontroller or a DSP may be used to process the digital signals. Furthermore, special RMS AC measurement or DC noise rejection algorithms may have to be run on the microcontroller or the DSP. Other implementations may use custom digital logic, such as FPGAs, to process the digital signals. The following algorithm would not be necessary if the processing device could store and process all data at the same time. However, certain physical limitations are inherent to the DSP architecture, such as a trade-off between on-board memory size and speed, power consumption and physical chip size, and others. Custom digital logic may have similar limitations.

As a result, the following algorithm enables computational devices such as DSP's to perform sophisticated and accurate RMS measurements for waveforms ranging from DC to high frequency. The following algorithm uses on the on-the-fly computation of interpolated window values. As a result, the algorithm can use any window, rather than being constrained to computationally efficient $sinc^N$ windows. RMS, or total RMS value, may be defined as sqrt (mean $(X^2)$), where X is the signal. In other words, RMS=sqrt(E $[X^2]$), where E[X] is the expected value of X. The RMS value of the AC component may be calculated by removing the DC energy, also referred to as the DC component (E[X]), from the total RMS value.

The ADC may receive the one or more analog signals (AC signal), and convert the analog signal data to a plurality of digital data points. The RMS computation unit may operate on the plurality of data points using a fixed point format. A first subset of the plurality of data points may comprise at least a part of the AC signal. The first subset of the plurality of data points may be received into and subsequently stored in one or more buffers.

First, the plurality of data points may be converted from a fixed point format to a floating point format. Next, a first subset of the plurality of data may be filtered using a digital filter. The next sequence of steps may be performed in real-time in a loop until the first subset in the one or more buffers is processed.

An interpolated window point may be calculated using a floating point format, or specifically it may be interpolated from window data. The window data may include data for a window, where the window includes one or more of a rectangular window, a Bartlett window, a Hanning window, a Hamming window, and a Kaiser-Bessel window. The interpolated window point required for this algorithm, $w_i$ may be the $i^{th}$ interpolated window point. Due to memory constraints, only one or more current interpolated window points required for the calculation may be stored in memory.

The interpolated window point, $w_n$, may be converted to the fixed point format. Next, intermediate results may be calculated. In other words, the interpolated window point, together with an $n^{th}$ filtered ADC data point, may be used to calculate the intermediate results. The intermediate results may be used by one or more of the AC RMS and DC component calculations by using the following summations—$\Sigma x_i w_i$; $\Sigma x_i^2 w_i$, and additional equations to calculate the AC RMS and DC component values. However, the speed at which the AC RMS and DC component values are calculated from the intermediate results does not have to occur in real-time.

The AC RMS and the DC component calculations may be performed using one or more of the single-precision floating point format, a double-precision floating point format, or any other type of a floating point format. The AC RMS and DC component calculations may be also performed using any combination of the floating point and the fixed point formats, such as only using the fixed-point format.

BRIEF DESCRIPTION OF THE FIGURES

FIG. 1 illustrates a computer system block diagram, according to one embodiment;

FIG. 2 illustrates a simple block diagram of a measuring device, according to one embodiment;

DETAILED DESCRIPTION OF THE FIGURES

FIG. 1—Computer System Block Diagram

Figure 3A:
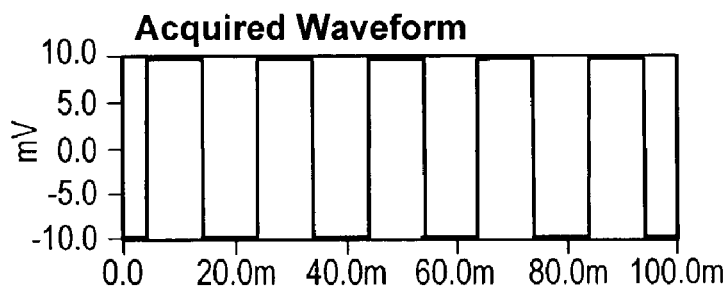
FIGS. 3a and 3b illustrate a window applied to a square signal, according to one embodiment.

FIG. 1 is a block diagram representing one embodiment of a computer system 101. It is noted that any type of computer system configuration or architecture can be used as desired, and FIG. 1 illustrates a representative PC embodiment. It is also noted that the computer system may be a general purpose computer system, a computer implemented on a VXI card installed in a VXI chassis, a computer implemented on a PXI card installed in a PXI chassis, or other types of embodiments. Elements of a computer not necessary to understand the present description have been omitted for simplicity.

The computer may include at least one central processing unit or CPU 160 which is coupled to a processor or host bus 162. The CPU 160 may be any of various types, including an x86 processor, e.g., a Pentium class, a PowerPC processor, a CPU from the SPARC family of RISC processors, as well as others. Main memory 166 may be coupled to the host bus 162 by means of a memory controller 164. The main memory 166 may store instrument drivers for communicating with DMMs, data acquisition cards, or other types of measurement devices.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used, such as ISA, VXI, PCMCIA, PC/104, PC/104+, and/or MicroDAQ. The expansion bus 170 includes slots for various devices such as measurement devices, including a data acquisition board 114 and/or a DMM 116. The computer system 101 further comprises a video display subsystem 180 and a hard drive 182 coupled to the expansion bus 170. In addition, the measurement device may be coupled to the computer system 101 by a network, such as Ethernet, USB, IEEE-1394, GPIB, RS-232/485, CAN, and/or DeviceNet, besides others.

In one embodiment, a measurement device, such as the DMM 116, may couple to a Unit Under Test, UUT (not shown). The measurement device may include a plurality of channels. Each of the channels on the measurement device may have one or more channel modes, where the mode may include coupling mode and voltage range. For example, each channel may operate in an AC or DC coupling mode. In addition, each channel may operate in one of a plurality of voltage ranges, such as ±1 Volt, ±5 Volts, and 0–5 Volts, besides others.

As noted above, various other embodiments are contemplated, such as a PXI system which includes a PXI instrument card in one or more PXI switch devices, a VXI system which includes a VXI system instrument card in one or more VXI switch devices, and other form factors including distributed I/O systems, such as FieldPoint available from National Instruments.

FIG. 2—Simple Block Diagram of a Measurement Device

FIG. 2 is a simple block diagram of a measurement device, according to one embodiment.

In one embodiment, a measurement device 200 such as a DMM 116 may include four basic units—an analog circuit path 202, an analog to digital converter (ADC) 204, a digital filter 206, and an RMS computation unit 208. As described above, the measurement device 200 may include a plurality of channels, where each channel may have one or more modes. The four basic units may be operable to multiplex and/or process one or more of the plurality of channels at the same time.

The analog circuit path 202 may include the necessary circuitry for the plurality of channels to couple to one or more analog signals. The analog circuit path 202 may include one or more of an analog interface, analog signal conditioning, voltage isolation units, multiplexers, and analog filters, besides others. The analog circuit path may couple to the ADC 204. The ADC may be operable to receive the one or more analog signals from the analog circuit path 202 and convert it to one or more digital signals.

The ADC 204 may be coupled to a digital filter 206. The digital filter 206 may be operable to correct the frequency response in a desired frequency range (i.e., a pass band) of the one or more digital signals using filter coefficients. The digital filter unit may produce one or more corrected digital signals, which may be propagated to the RMS computation unit 208. In one embodiment, the digital filter includes one or more of an FIR filter and an IIR filter. In one embodiment, the digital filter may include one or more memory devices (not shown) operable to store filter coefficients.

The RMS computation unit 208 may be operable to compute the RMS of the one or more corrected digital signals, such as described below with reference to FIG. 5.

In addition, the measurement device may include one or more memory devices. The one or more memory devices may be operable to store the digital filter coefficients. The one or more memory devices may include one or more of EEPROMs, flash memory devices, and/or any other types of non-volatile memory devices.

It is noted that the block diagram of FIG. 2 is exemplary only. Further, various units of FIG. 2 may be present in different order than that shown, or may not be present, as desired. Also, various additional units may be included as desired.

FIGS. 3 and 4—A Window Applied to Square and Sinusoidal Signals

Figure 3B:
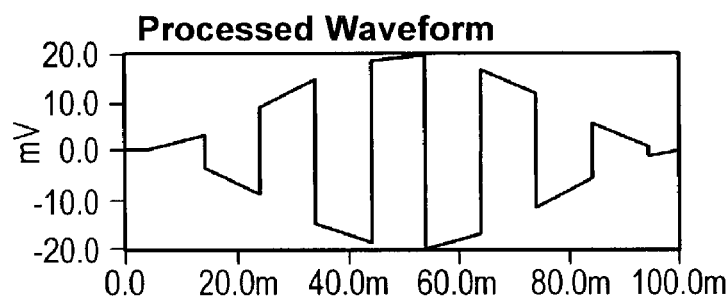
Figure 4A:
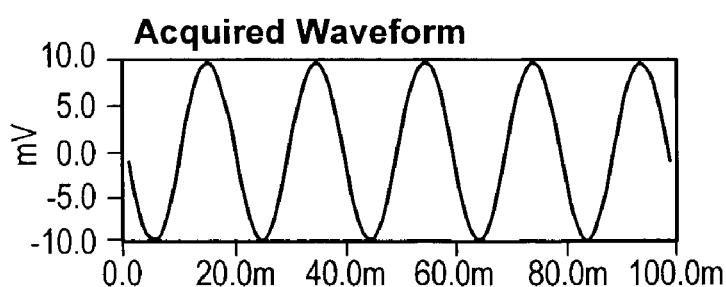
FIGS. 4a and 4b illustrate a window applied to a sine signal, according to one embodiment.

FIG. 3a illustrates a square signal and FIG. 3b illustrates the result of a window applied to the square signal, according to one embodiment. The square wave may be acquired by the analog circuit path and the ADC, such as described above with reference to FIG. 2, to produce an acquired waveform. In other embodiments, the acquired waveform may be stored and later retrieved using a memory device, such as computer memory (i.e., RAM, ROM, and Compact-Flash, besides others), or removable memory, such as a hard drive, CD media, DVD media, and/or floppy disk, besides others.

Figure 4B:
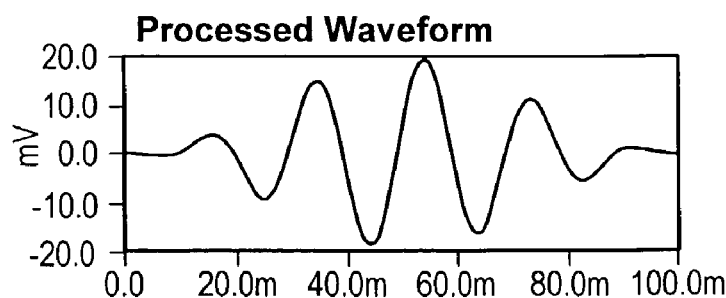

In one embodiment, an RMS measurement may be performed on the acquired waveform. In one embodiment, the RMS measurement may use a window in order to provide a good estimate of the input signal. Windowing operates to provide a good estimate of the input signal when the input signal does not have an integer number of periods of the waveform. Similarly, FIG. 4b illustrates a result when a window is applied to a sine waveform of FIG. 4a.

Windows may be applied to an acquired signal when the acquired signal does not have an integer number of periods of the waveform. Spectral leakage is the result of an assumption in an FFT algorithm used by many digital processing units, such as the RMS measurement unit, that the time record is exactly repeated throughout and that signals contained in a time record are periodic at intervals that correspond to the length of the time record. If a time record has a nonintegral number of cycles, this assumption may be violated and spectral leakage may occur. Windowing of data is equivalent to convolving spectrum of the data with spectrum of a window. In one embodiment, in order to window the data, one running sum may be needed. The running sum may be used to calculate ($X^2$*window), where X is the data, also referred to herein as the input signal.

Figure 5:
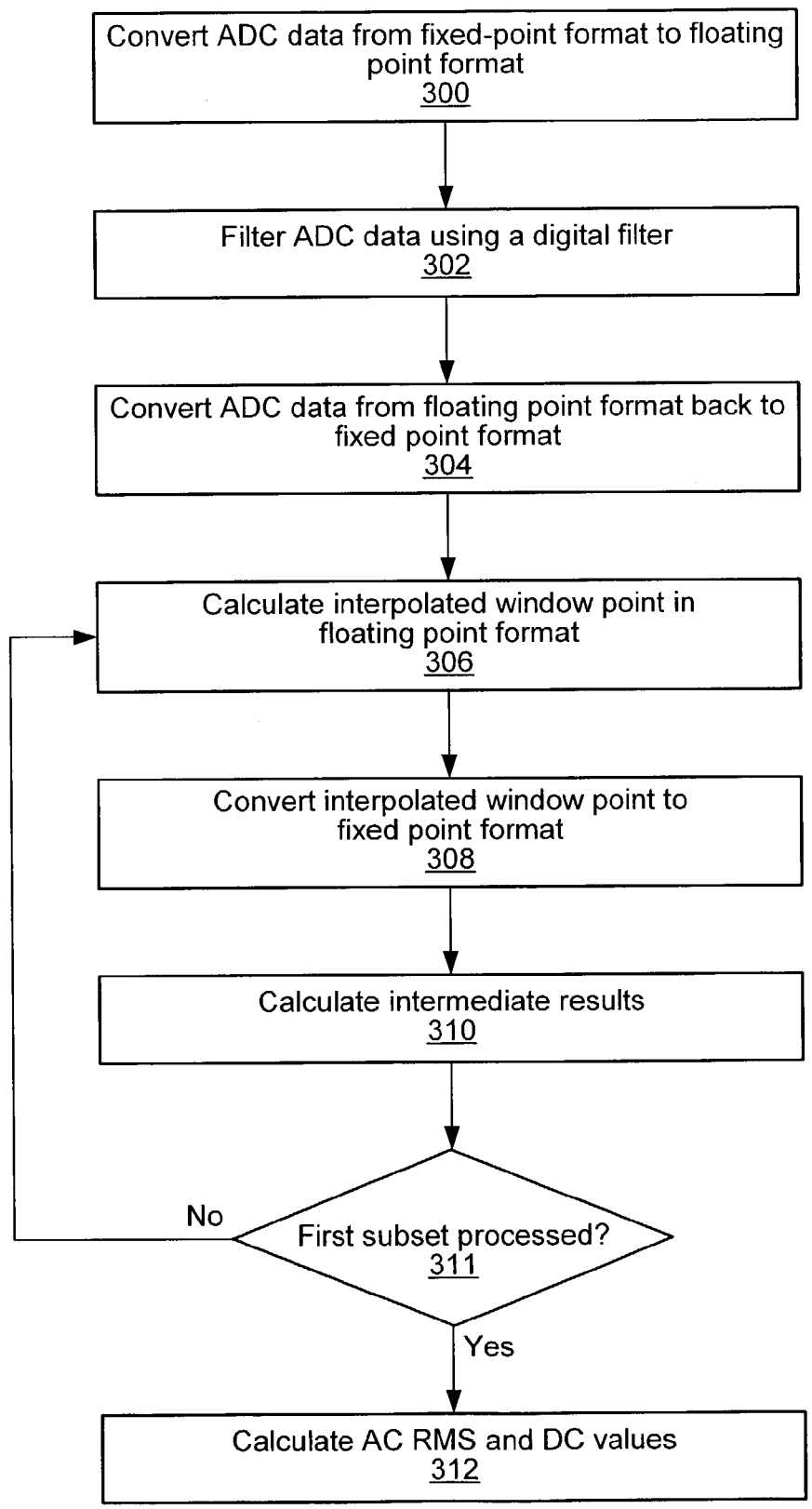
FIG. 5 is a flowchart of a method for calculating an RMS value of a signal, according to one embodiment.

FIG. 5—A Flowchart of a Method for Calculating an RMS Value of a Signal

FIG. 5 is a flowchart of a method for calculating an RMS value of a signal, according to one embodiment. RMS may be defined as sqrt (mean($X^2$)), where X is the signal. In other words, RMS=sqrt(E[$X^2$]), where E[X] is the expected value of X. In one embodiment, the flowchart describes calculating an RMS value of the AC component by removing the DC energy, herein referred to as the DC component, i.e. E[X], from the total RMS value. In one embodiment, this calculation may require a second running sum, sum(X * window). In one embodiment, the RMS value of the AC component, referred to herein as the AC RMS, ignoring window scaling issues, may be substantially equal to sqrt ((sum($X^2$)*window)−(sum(X*window))$^2$). In one embodiment, the following algorithms may be implementd using an RMS computation unit, such as the RMS computation unit 208 described above with reference to FIG. 2.

As described above with reference to FIGS. 1 and 2, an analog signal may be processed by an Analog-to-Digital Converter (ADC). In one embodiment, the ADC may be a high-speed high-resolution ADC, such as described in a related co-pending application Ser. No. 10/388,296, titled "High-Speed High-Resolution ADC for Precision Measurements" filed Mar. 12, 2003, which is hereby incorporated by reference. In other words, the ADC may receive the analog data, also referred to herein as an AC signal, and convert the analog data to a plurality of data points. In one embodiment, the ADC may operate on the plurality of data points using a fixed point format. In one embodiment, a first subset of the plurality of data points may comprise at least a part of the AC signal. In one embodiment, the first subset of the plurality of data points may be received and subsequently stored in one or more buffers.

In 300, the plurality of data points may be converted from a fixed point format to a floating point format. The fixed point format may be one or more of a 2's complement format, a 1's complement format, or any other fixed point format. The floating point format may be one or more of a single-precision floating point format, a double-precision floating point format, or any other floating point format. For example, a fixed point value of '0x0001' is equal to '1' decimal, '00000000000001' binary, and '1.000 . . . ' in the floating point format.

In one embodiment, the algorithm for converting data from the fixed point format to the floating point format includes:

1) Load fixed point data (i)

2) Load fixed point data (i+1)
   Convert Fixed To Float (fixed point data (i))
3) Store floating point data (i)
   Convert Fixed To Float (fixed point data (i+1))
4) Store floating point data (i+1)

In one embodiment, the above algorithm may be executed on a digital signal processor such as a SHARC DSP available from Analog Devices. In other embodiments, the above algorithm may be executed on one or more of a DSP, a microcontroller, a microprocessor, an FPGA, or any other type of a computational device (not shown). In one embodiment, the above mentioned algorithm may execute for [two*(buffer size)] clock cycles to convert the data in a buffer, where the buffer holds 'buffer size' number of data elements. The above algorithm may be efficient as the data bus of the computational device, which may be utilized on every clock cycle. In one embodiment, the data bus of the computational device may be the bottleneck for the execution of the above algorithm.

In 302, the first subset of the plurality of data may be filtered using a digital filter. In other words, the first subset of the plurality of data in the floating point format may be filtered using a digital filter. In one embodiment, the digital filter may be designed to have the inverse frequency response of the analog circuit path 202 and the ADC 204, as described above with reference to FIG. 2. The digital filter can be one or more of an FIR digital filter and an IIR digital filter. In one embodiment, the digital filter used by 302 may be the digital filter 206 as described above with reference to FIG. 2.

In one embodiment, the digital filter may be an FIR filter with a single-precision array based function. The FIR filter may take as input an array of floating point data points and an array of filter taps. The FIR filter may further apply the filter to the points in place in memory. In other words, no additional memory may be needed to store the filtered data, but the original data may be lost as a result of the filtering.

In one embodiment, the FIR filter may have a transient response equal to the length of the filter. For example, for an FIR filter comprising 12 taps, the first 12 data points may be corrupted. For a sufficiently large data set, the first 12 data points may have minimal impact. Alternatively, the first 12 data points may be ignored, if doing so proves advantageous.

In 304, the acquired data may be converted back to the fixed point format from the floating point format. In one embodiment, 304 may operate to reverse 302. In other words, the first filtered subset may be converted back to the fixed point format.

In one embodiment, 306–310 may be performed in a loop until the first subset in the one or more buffers is processed. In one embodiment, 306–310 may be performed in real-time.

In 306, an interpolated window point may be calculated in a floating point format, such as described below with reference to FIG. 6. In one embodiment, the interpolated window point may be interpolated from window data. The window data may include data for a window, where the window includes one or more of:

a rectangular window;
a Bartlett window;
a Hanning window;
a Hamming window; and
a Kaiser-Bessel window.

In addition, the window may be independent of $sinc^N$ windows, usually used since they are computationally effective. In one embodiment, the window may be selected by one or more of a user and a computer.

The interpolated window point required for this algorithm, $w_i$, may be the $i^{th}$ interpolated window point. In one embodiment, the interpolated window point may not be stored in memory at all times since the number of window points would be too large, i.e., on the magnitude of millions of data points for a 1-second "dwell-time". Instead the $w_i$ may be created dynamically by linear interpolation as needed. The linear interpolation may use two arrays, window_base and window_delta, where: window_delta$_i$=window_base$_{i+1}$−window_base$_i$ The window_base$_i$ may be calculated prior to compile time, and may be compiled into the algorithm. In one embodiment, the window_delta$_i$ may be calculated as part an initialization phase. In other embodiment, the window_delta$_i$ may be calculated at compile time.

This step may calculate a "fraction_window_index" and an "integer_window_index". Prior to entering this algorithm, the "fractional_window_index_base" may be calculated, where:

$$\text{fractional\_window\_base\_index} = \frac{SizeOf(\text{window\_base}_i)}{\text{Number\_Of\_ADC\_Data\_points\_Acquired}}$$

For example, for an acquisition of 1,000,000 data points and a 1000-point window_base, the fractional_window_base_index may be 0.001. The fractional_window_index may be calculated as follows:

$$\text{fractional\_window\_index}_n = \sum_{i=1}^{n} \text{fractional\_window\_index\_base} = n * \text{fractional\_window\_index\_base}$$

integer_window_index$_n$=round_down(fractional_window_index$_n$)

remainder_window_index$_n$=fractional_window_index$_n$−round_down(fractional_window_index$_n$)

The $w_i$ may be calculated as follows:

$w_n$=window base[integer window_index]+window_delta[integer_window_index]*remainder_window_index In 308, the interpolated window point may be converted to the fixed point format. In other words, the $w_n$ calculated in 306 may be converted to the fixed point format.

In 310, intermediate results may be calculated. The interpolated window point, together with the $n^{th}$ filtered ADC data point, may be used in the following equations:

$\Sigma x_i w_i$; $\Sigma x_i^2 w_i$;

where $x_i$ may be the $i^{th}$ filtered ADC data point, and $w_i$ may be the $i^{th}$ interpolated window point in fixed point format.

Since the data point $x_n$ and the window point $w_n$ may be both available, the following computations may be performed:

$(\Sigma x_i w_i)_{new} = (\Sigma x_i w_i)_{old} + x_n \cdot w_n$     a)

This may include one multiply-and-accumulate (MAC) operation. The dynamic range of this operation may be limited by the width of the accumulator register, if one exists in the computational device.

$x_n^2 = x_n \cdot w_n$     b)

This may include one fixed point multiply. This step may be needed as the intermediate multiplication result from (a) may not be accessible.

$(\Sigma x_i^2 w_i)_{new} = (\Sigma x_i^2 w_i)_{old} + x_n^2 \cdot w_n$     c)

In 312, one or more of the AC RMS and DC component values may be calculated. After the $\Sigma x_i w_i$; $\Sigma x_i^2 w_i$ summations are finished, the following equations may be used to calculate the AC RMS and DC component values:

$$DC = \frac{\sum_{i=1}^{n} x_i w_i}{\text{Mean\_Value\_Of\_Window}}$$

$$AC = \sqrt{\frac{\sum_{i=1}^{n} x_i^2 w_i}{\text{Mean\_Value\_Of\_Window}} - DC^2}$$

In one embodiment, the speed at which the above calculations are done may be less time critical than 300-308, and it may not have to occur in real-time. In one embodiment, the AC RMS and the DC component calculations may be performed using one or more of the single-precision floating point format, a double-precision floating point format, or any other type of a floating point format. In other embodiments, the AC RMS and DC component calculations may be performed using any combination of the floating point and the fixed point formats. In yet additional embodiments, the AC RMS and DC component calculations may be performed using the fixed point format.

Algorithm Notes

Furthermore, in 310, a floating point round-off error may occur. In order to prevent the round-off error, a fixed point representation of data may be necessary. For example, the $\Sigma x_i w_i$; $\Sigma x_i^2 w_i$ calculations may become corrupted when a index of summation reaches values as high as 1 to 2 million. In one embodiment, this part of the algorithm may be performed using data in the fixed point format. However, the fixed point format may require monitoring of a possible overflow as well as careful calculation of dynamic range restrictions.

For example, dynamic range for multiplication may be restricted. If an output of a multiplication is used in MAC, it can have a 64-bit dynamic range. If the output of the multiplication is to be reused in another multiplication or addition, it should not exceed a 32-bit dynamic range. For example, the $x_n^2 = x_n \cdot x_n$ equation has a dynamic range of $2^{14-1} \cdot 2^{14-1} = 2^{26} < 2^{32-1} = 2^{31}$, and the dynamic range restriction is satisfied.

In another example, the $(\Sigma x_i^2 w_i)_{new} = (\Sigma x_i^2 w_i)_{old} + x_n^2 \cdot w_n$ equation has a dynamic range of $2^{13} \cdot 2^{13} \cdot 2^{Max\_Bits\_of\_Window} = 2^{26+Max\_Bits\_Window} \leq 2^{64-1} = 2^{63}$, hence Max_Bits_of_Window$\leq 63-26=37$. The maximum value of the window using floating point format should not exceed $2^{37}=137,438,953,472$, and 35-bit representation instead of 36-bit representation if signed 2's complement format is used.

Another possible restriction is an accumulation restriction. The $\Sigma x_i^2 w_i$ equation may have accumulation with the largest dynamic range. For example, in the equation $\Sigma x_i^2 w_i \leq 2^{80-1} = 2^{79}$, the dynamic range is 79-bits. Hence Max_Number_of_Data_Points*Max_Window_Value*$x_n^2 \leq 2^{79}$ $$\text{Max\_Number\_of\_Data\_Points*Max\_Window\_Value}*2^{13-2} \leq 2^{79}$$

$$\text{Max\_Number\_of\_Data\_Points*Max\_Window\_Value}*2^{26} \leq 2^{79}$$

$$\text{Max\_Number\_of\_Data\_Points*Max\_Window\_Value} \leq 2^{53}$$

In order to limit acquisition to n-seconds:

$$1{,}800{,}000 * n * \text{Max\_Window\_Value} \leq 2^{53}$$

$$\text{Max\_Window\_Value} \leq \frac{2^{53}}{1{,}800{,}00 * n}$$

$$\text{Max\_Window\_Value} \leq \frac{5003999585}{n}$$

In order to operate on 6 cycles of a 3-Hz waveform, 2 seconds may be needed for a real-time operation. Therefore the window max value should be limited to about 2.4 billion. This is a conservative assumption as the max window value is used instead of the mean window value. This assumption also assumes that ADC data points have full-scale range instead of more evenly distributed range.

For the DC component calculation, the requirement on the accumulator may include:

$$\text{Max\_Time} \leq (\text{Max\_ADC\_Value} \div \text{Number\_Of\_Data\_Points\_Per\_Second})$$

$$\text{Max\_Time} \leq \frac{2^{79}}{2^{13} * 1800000} \text{ seconds.}$$

Another floating point rounding error may occur in 306, specifically in calculation of fractional_window_base_index. The problem may be similar to the floating point rounding error described above with reference to 310. Because additions in 306 may be performed with operands that are orders of magnitude apart, floating point rounding errors may occur and the fractional_window_index may be out of range. A running summation may be used to calculate fractional_window_index (i). To solve the floating point rounding error, the fractional_window_index (i) should be recalculated at the end of each buffer from the original values.

In one embodiment, there may be a transient associated with the FIR digital filter that may introduce an error to the calculations. The transient may be eliminated by adding a second pair of data buffer pointer/data count global variables and manually manipulating this second pair of data buffers/data count global variables to skip the transient response of the filter.

Next, in one embodiment, there may be a second transient response issue associated with the summation $$\sum_{i=1}^{n} |h[i]|.$$

In one embodiment, it may be possible that the transient response of a nonlinear phase FIR filter may cause the output of the digital filter to exceed $\pm 2^{15}$. If this occurs in conjunction with squaring a data point, the result may exceed $\pm 2^{31}$, and thus may cause an unacceptable fixed point overflow.

However, since $$\max_{n}(y[n]) = \left(\sum_{i=1}^{n} |h[i]|\right) \max_{n}(x[n]);$$

and since $$\max_{n}(x[n]) \leq \pm 8192,$$

then if $$4 \geq \left(\sum_{i=1}^{n} |h[i]|\right)$$

is true, then $$\max_{n}(y[n]) \leq 4(8192) = 32768 = 2^{15}.$$

To make sure that $$4 \geq \left(\sum_{i=1}^{n} |h[i]|\right),$$

the Inverse Discrete Time Fourier Transform and the triangle inequality may be used:

$$h[n] = \frac{1}{2\pi} \int_{-\pi}^{\pi} H(e^{j\omega}) e^{j\omega n} d\omega \; |h[n]| =$$

$$\left|\frac{1}{2\pi}\int_{-\pi}^{\pi} H(e^{j\omega})e^{j\omega n} d\omega\right| \leq \frac{1}{2\pi}\int_{-\pi}^{\pi} |H(e^{j\omega})e^{j\omega n}| d\omega \leq$$

$$\frac{1}{2\pi}\int_{-\pi}^{\pi} |H(e^{j\omega})||e^{j\omega n}| d\omega = \frac{1}{2\pi}\int_{-\pi}^{\pi} |H(e^{j\omega})| d\omega$$

If the following can be bound: $A \leq |H(e^{j\omega})| \leq B; \omega \in [0,\pi]$; then, $$\frac{1}{2\pi}\int_{-\pi}^{\pi} |H(e^{j\omega})| d\omega \leq B$$

|h[n]|=B $$B \cdot n \geq \left(\sum_{i=1}^{n} |h[i]|\right)$$

For a 12-tap filter, this may become:

$$B \cdot 12 \geq \left( \sum_{i=1}^{n} |h[i]| \right)$$

For a worst case gain of 1.2, this may become:

$$16 \geq 1.2 \cdot 12 \geq \left( \sum_{i=1}^{n} |h[i]| \right)$$

The filter can be pre-scaled since 16 is greater than 4. Under these assumptions, the worst case scale factor would be less than 4. The aspect of performance that might suffer under this compression would be linearity. Assuming all linearity errors are due to this issue, which may not be the case, it would move the breakpoint in the linearity from 0.1% to 0.4%.

In one embodiment, linear interpolation inaccuracies may arise due to repeated floating point summations of the fractional index value. This problem may occur during the following calculation:

$$\text{fractional\_window\_index}_n = \sum_{i=1}^{n} \text{fractional\_window\_index\_base} = n * \text{fractional\_window\_index\_base}$$

In one embodiment, if the algorithm implementation uses the summation listed above, an error may accumulate as the summation progresses. This may be solved by moving the calculation to the multiplicative implementation shown above. In the above equation, n is an integer, so by using integer math precision issues should be eliminated. This would require converting the integer representation of n to a floating point representation of n, thus resulting in a larger algorithm. However, as Mr. Steven W. Smith points out in "The Scientist and Engineer's Guide to Digital Signal Processing" (Analog Devices, pg. 76):

"single precision floating point has an exact binary representation for every whole number between +−16.8 million (to be exact, 2^24) . . . This allows floating point whole numbers (between +−16.8 million) to be added, subtracted, and multiplied with no round-off error."

And since data is acquired at 1.80000^6 samples/sec, data can be acquired continuously for $$\frac{2^{24}}{1.8 * 10^6}$$

seconds without any concern of roundoff error in n.

It is noted that the flowchart of FIG. 5 is exemplary only. Further, various steps in the flowchart of FIG. 5 may occur concurrently or in different order than that shown, or may not be performed, as desired. Also, various additional steps may be performed as desired.

Figure 6:
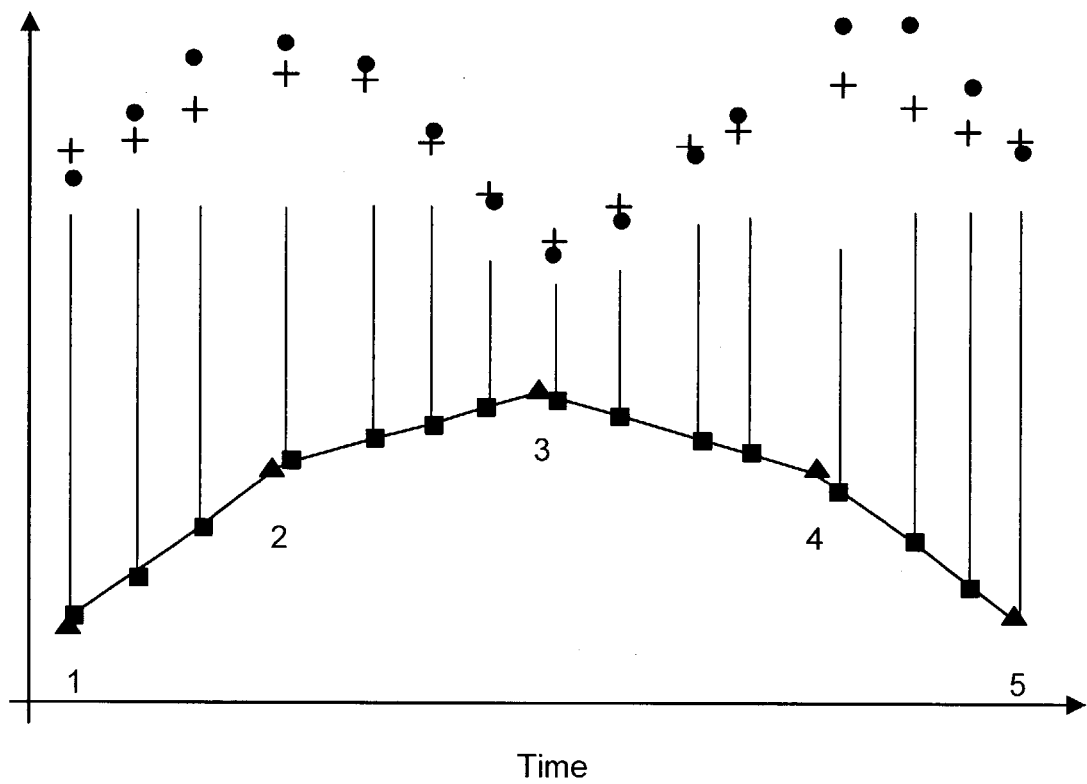
FIG. 6 illustrates interpolating window points to align with an input signal, according to one embodiment.

FIG. 6—Interpolating Window Points to Align with an Input Signal

FIG. 6 illustrates interpolating window points to align with an input signal, according to one embodiment. An input waveform may be stored in a buffer as a first subset. A window may be used to provide a good estimate of the input signal when the input waveform does may not have an integer number of periods.

Due to memory constraints, only a small number of window points may be stored by a computational device. For example, FIG. 6 illustrates five window points stored by the computational device. However, the first subset contains data that are not aligned with the first subset. Therefore the computational device may interpolate window points to generate interpolated window points that are aligned with the data points from the first subset. Next, the interpolated window points may be used to perform a windowing operation with the first subset to generate a processed waveform. In other words, the windowing operation of a data point from the input waveform and the interpolated window point operates to generate intermediate results, such as described below with reference to 310 in FIG. 5. In one embodiment, the windowing operations include the two running sums, sum($x^2$*w) and sum(x*w).

FIGS. 7–12—Noise rejection settings for DC Noise Rejection

FIGS. 7–12 illustrate noise rejection settings for DC noise rejection, according to one embodiment. In one embodiment, DC noise rejection may include calculating and then removing the DC component from an acquired signal. In one embodiment, DC noise rejection is similar to the algorithm described above with reference to FIG. 5 with one or more of 300, 302, and 304 skipped.

In other words, each DC reading may be an average of multiple high-speed samples. By adjusting the relative weighting of those samples, the sensitivity to different interfering frequencies may be adjusted. In one embodiment, different weightings may be offered, including normal, second-order, and high-order, besides others.

| DC Noise Rejection Setting | Lowest Frequency for Noise Rejection | High-Frequency Noise Rejection |
| --- | --- | --- |
| Normal | $1/t_{aperture}$ | Good |
| Second-order | $2/t_{aperture}$ | Better |
| High-order | $4/t_{aperture}$ | Best |

Figure 7:
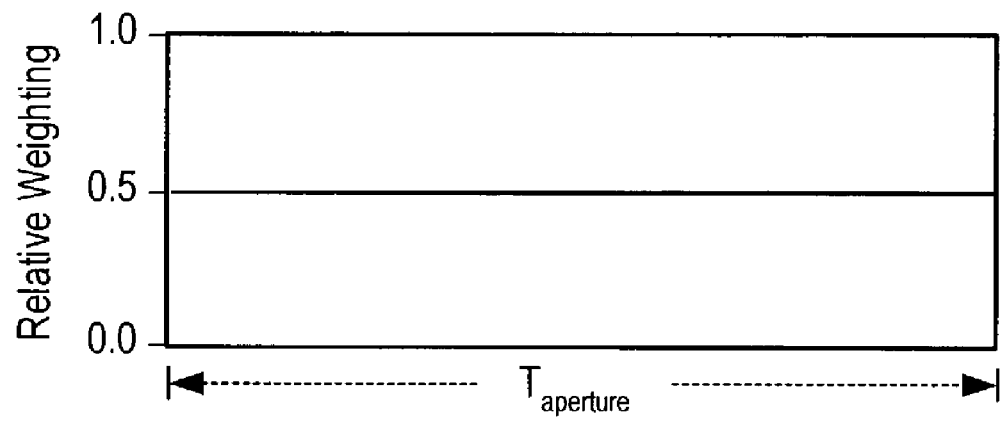
FIGS. 7 and 8 illustrate normal noise rejection setting for DC noise rejection, according to one embodiment.
Figure 8:
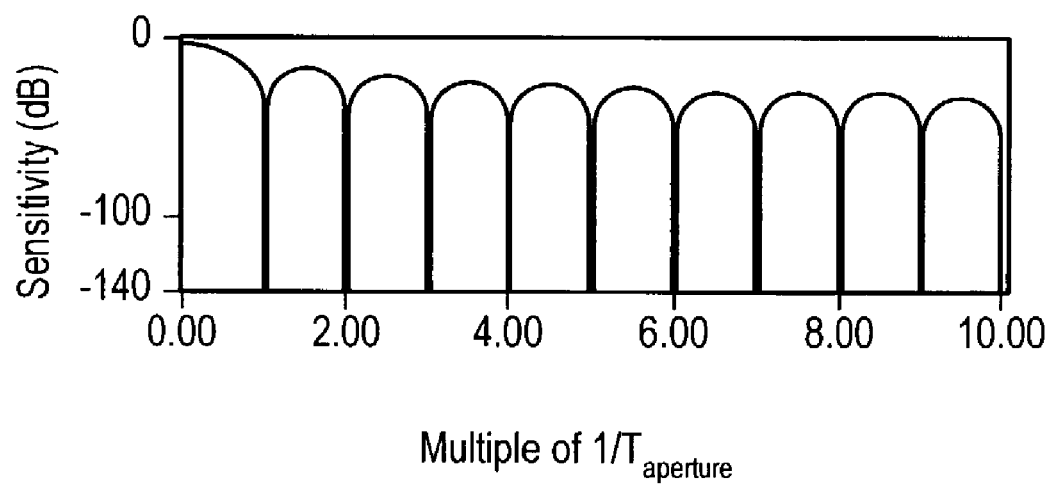

FIGS. 7–8—Normal Noise Rejection Settings

In one embodiment, for normal DC noise rejection, all samples may be weighted equally. This feature emulates the behavior of most traditional DMMs, providing good rejection of frequencies at multiples of $f_0$, where $f_0=1/t_{aperture}$. FIGS. 7–8 illustrate normal weighting where all samples may be weighted equally, and the resulting noise rejection as a function of frequency, according to one embodiment. Good noise rejection may be obtained only near multiples of $f_0$. For fastest readings with more power line noise rejection, the aperture may need to be set to the power line period, such as 16.667 msec for a 60 Hz power line frequency, and the DC noise rejection may need to be set to normal.

Figure 9:
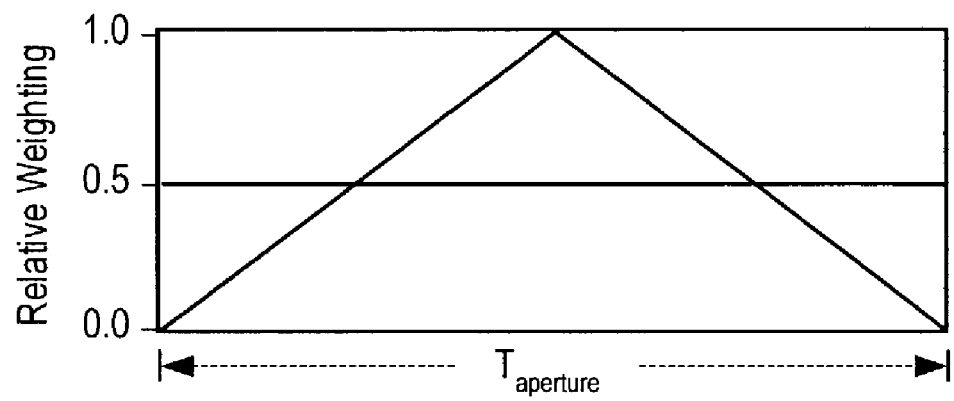
FIGS. 9 and 10 illustrate second-order noise rejection setting for DC noise rejection, according to one embodiment.
Figure 10:
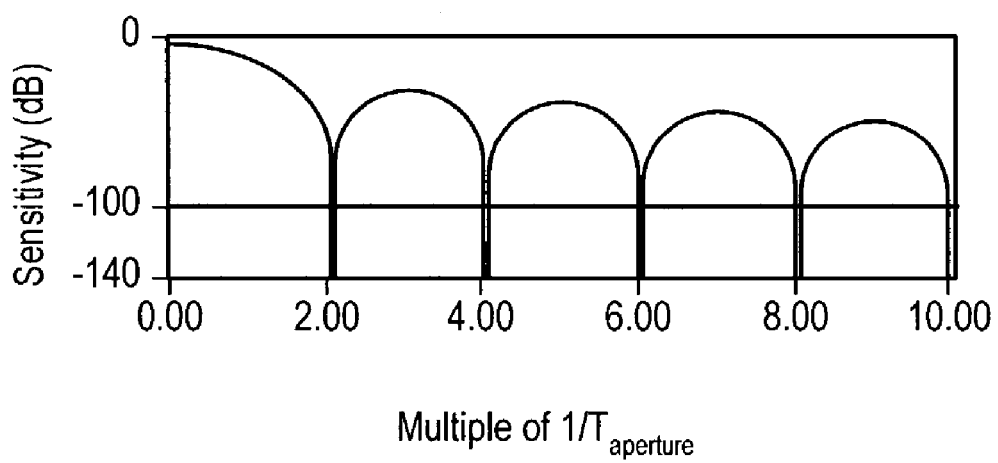

FIGS. 9–10—Second-Order Noise Rejection Setting

In one embodiment, second-order DC noise rejection may apply a triangular weighting to the measurement samples, as shown in FIGS. 9–10. When using second-order DC noise rejection, the samples taken in the middle of the aperture time may be weighted more than samples taken at the beginning and at the end of the measurement.

In one embodiment, when using second-order DC noise rejection, a good noise rejection near even multiples of $f_0$ may be obtained, and this rejection may increase more rapidly with frequency than when using normal sample weighting. In addition, response notches may be wider than when using normal weighting, resulting in less sensitivity to variations in noise frequency. The second-order DC noise rejection may result in better power line noise rejection than one obtained using normal DC noise rejection. For example, the aperture may be set to 33.333 msec for a 60 Hz power line frequency. In addition, the second-order DC noise rejection may be faster than a high-order noise rejection.

Figure 11:
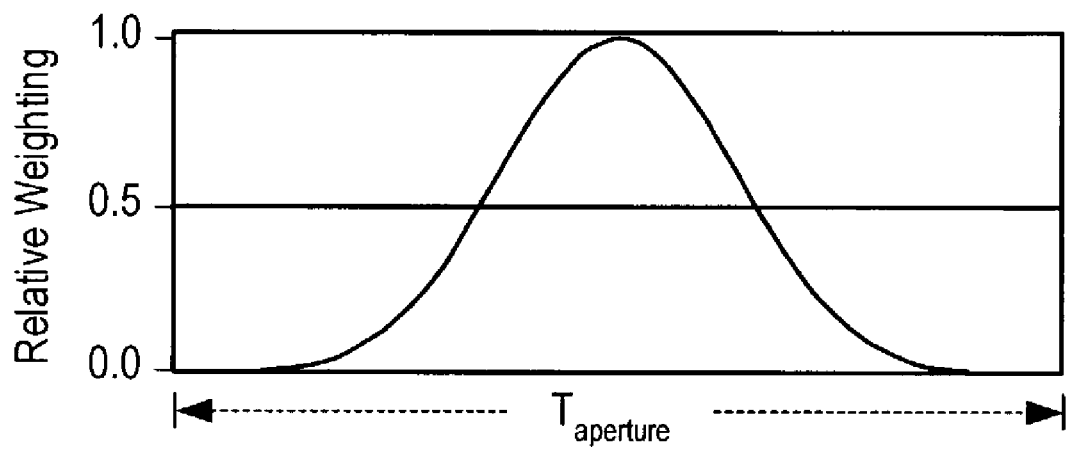
FIGS. 11 and 12 illustrate high-order noise rejection settings for DC noise rejection, according to one embodiment.
Figure 12:
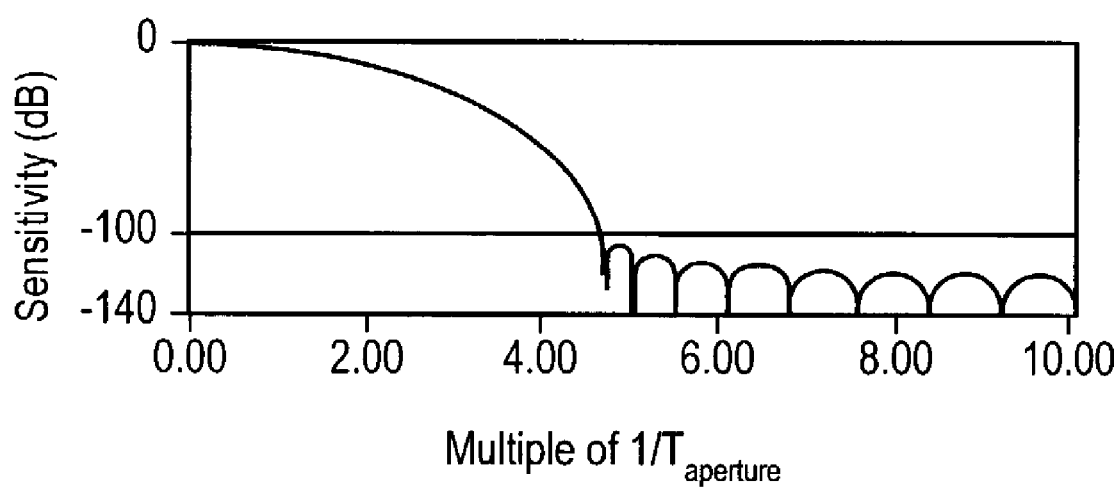

FIGS. 11–12—High-Order Noise Rejection Setting

FIGS. 11 and 12 illustrate high-order sample weighting and the resulting noise rejection as a function of frequency, according to one embodiment. In one embodiment, the higher-order noise rejection setting may result in good noise rejection starting at four times $f_0$ and excellent noise rejection above about 4.5 times $f_0$. Sensitivity to noise at any frequency above 4.6 times $f_0$ may be small. In one embodiment, the high-order DC noise rejection with a 100 msec aperture (10 readings/sec) may deliver a full 6½digit accuracy with over 1 volt of interfering power line noise on a 10V range at any frequency above 46 Hz.

In one embodiment, a tradeoff of using the high-order noise rejection settings may be that in order to obtain power line rejection, the measurement aperture may need to double for the second-order noise rejection setting or quadruple for the high-order noise rejection setting when compared to the measurement aperture for the normal setting. This relatively small increase in aperture time may result in a large reduction of the interfering noise signal.

Although the embodiments above have been described in considerable detail, numerous variations and modifications will become apparent to those skilled in the art once the above disclosure is fully appreciated. It is intended that the following claims be interpreted to embrace all such variations and modifications.

The invention claimed is:

1. A method for calculating an RMS value of an AC signal, the method comprising:
   receiving a plurality of data points from an analog-to-digital converter, wherein the analog-to-digital converter is comprised in a measurement system, wherein the plurality of data points comprise at least a part of the AC signal;
   calculating an interpolated window point from window data, wherein the window data comprises data for a window;
   calculating intermediate results using the interpolated window point and a data point from a first subset of the plurality of data points; and
   calculating an AC RMS value for the plurality of data points using the intermediate results.

2. The method of claim 1,
   wherein said calculating the interpolated window point is performed in real-time to align window data with the first subset of the plurality of data points.

3. The method of claim 1, further comprising:
   filtering the first subset of the plurality of data points using a digital filter prior to said calculating the interpolated window point.

4. The method of claim 3, further comprising:
   converting the first subset from a fixed point format to a floating point format prior to said filtering the first subset using the digital filter; and
   converting the first subset from the floating point format back to the fixed point format after said filtering the first subset using the digital filter.

5. The method of claim 3, further comprising:
   converting the interpolated window point from a floating point format to a fixed point format after said filtering the first subset using the digital filter and prior to said calculating the intermediate results.

6. The method of claim 5,
   wherein said receiving the plurality of data points comprises receiving the first subset and subsequently storing the first subset in one or more buffers.

7. The method of claim 6,
   wherein said calculating the interpolated window point, converting the interpolated window point to the fixed point format, and calculating the intermediate results are performed in a loop until the first subset in the one or more buffers is processed.

8. The method of claim 3,
   wherein said calculating the interpolated window point comprises calculating the interpolated window point in a floating point format.

9. The method of claim 3,
   wherein a fixed point format comprises one or more of:
   2's complement format; and
   1's complement format.

10. The method of claim 3,
    wherein a floating point format comprises one or more of:
    a single-precision floating point format; and
    a double-precision floating point format.

11. The method of claim 3,
    wherein the digital filter comprises at least two taps.

12. The method of claim 3,
    wherein the digital filter comprises one or more of:
    an FIR filter;
    an IIR filter.

13. The method of claim 1,
    wherein said calculating the interpolated window point from the window data comprises interpolating the interpolated window point from the window data, wherein the window comprises one or more of:
    a rectangular window;
    a Bartlett window;
    a Hanning window;
    a Hamming window;
    a Kaiser-Bessel window; and
    any other window.

14. The method of claim 13,
    wherein the window is independent of $sinc^N$ windows.

15. The method of claim 13,
    wherein the window is operable to be selected by one or more of a user and a computer.

16. The method of claim 1,
    wherein the plurality of data points comprises data points acquired during a measurement aperture.

17. The method of claim 1,
    wherein said calculating the intermediate results using the interpolated window point and the data point from the first subset comprises calculating:

$\Sigma x_i w_i$; and $\Sigma x_i^2 w_i$;

wherein $x_i$ is an $i^{th}$ data point from the first subset; and
wherein $w_i$ is an $i^{th}$ interpolated window point.

18. The method of claim 17,
wherein said calculating $\Sigma x_i w_i$ comprises calculating:

$$(\Sigma x_i w_i)_{new} = (\Sigma x_i w_i)_{old} + x_n \cdot w_n;$$

wherein $(\Sigma x_i w_i)_{old}$ comprises a previous calculation for a previous data point and $x_n \cdot w_n$ comprises a current interpolated window point and a current data point from the first subset.

19. The method of claim 17,
wherein said calculating $\Sigma x_i^2 w_i$ comprises calculating:

$$(\Sigma x_i^2 w_i)_{new} = (\Sigma x_i^2 w_i)_{old} + x_n^2 \cdot w_n;$$

wherein $(\Sigma x_i^2 w_i)_{old}$ comprises a previous calculation for a previous data point and $x_n^2 \cdot w_n$ comprises a current interpolated window point and a current data point from the first subset.

20. The method of claim 17,
wherein said calculating the AC RMS value for the plurality of data points comprises calculating:

$$DC = \frac{\sum_{i=1}^{n} x_i w_i}{n \cdot \text{Mean\_Value\_Of\_Window}}; \text{ and}$$

$$AC = \sqrt{\frac{\sum_{i=1}^{n} x_i^2 w_i}{n \cdot \text{Mean\_Value\_Of\_Window}} - DC^2};$$

wherein n is the number of data points in one or more buffers storing the first subset;
wherein the Mean_Value_Of_Window is a mean value of the window data.

21. A method for calculating a DC component of a signal, the method comprising:
receiving a plurality of data points from an analog-to-digital converter, wherein the analog-to-digital converter is comprised in a measurement system;
calculating an interpolated window point from window data, wherein the window data comprises data for a window;
calculating intermediate results using the interpolated window point and a data point from a first subset of the plurality of data points; and
calculating a DC component value for the plurality of data points using the intermediate results.

22. The method of claim 21,
wherein said calculating the interpolated window point is performed in real-time to align window data with the first subset of the plurality of the data points.

23. The method of claim 22,
wherein said calculating the interpolated window point comprises calculating the interpolated window point in a floating point format.

24. The method of claim 21,
wherein said receiving the plurality of data points comprises receiving the first subset and subsequently storing the first subset in one or more buffers.

25. The method of claim 21, further comprising:
converting the interpolated window point from the floating point format to a fixed point format.

26. The method of claim 25,
wherein said calculating the interpolated window point, converting the interpolated window point to the fixed point format, and calculating the intermediate results are performed in a loop until the first subset in the one or more buffers is processed.

27. The method of claim 21,
wherein a fixed point format comprises one or more of:
2's complement format; and
1's complement format.

28. The method of claim 21,
wherein a floating point format comprises one or more of:
a single-precision floating point format; and
a double-precision floating point format.

29. The method of claim 21,
wherein said calculating the interpolated window point from the window data comprises interpolating the interpolated window point from the window data, wherein the window data comprises data for a window, wherein the window comprises one or more of:
a rectangular window;
a Bartlett window;
a Hanning window;
a Hamming window;
a Kaiser-Bessel window; and
any other window.

30. The method of claim 29,
wherein the window is independent of $\text{sinc}^N$ windows.

31. The method of claim 29,
wherein the window is operable to be selected by one or more of a user and a computer.

32. The method of claim 21,
wherein the plurality of data points comprises data points acquired during a measurement aperture.

33. The method of claim 21,
wherein said calculating the intermediate results using the interpolated window point and the data point from the first subset comprises calculating:

$$\Sigma x_i w_i;$$

wherein $x_i$ is an $i^{th}$ data point from the first subset; and
wherein $w_i$ is an $i^{th}$ interpolated window point.

34. The method of claim 33,
wherein said calculating $\Sigma x_i w_i$ comprises calculating:

$$(\Sigma x_i w_i)_{new} = (\Sigma x_i w_i)_{old} + x_n \cdot w_n;$$

wherein $(\Sigma x_i w_i)_{old}$ comprises a previous calculation for a previous data point and $x_n \cdot w_n$ comprises a current interpolated window point and a current data point from the first subset.

35. The method of claim 33,
wherein said calculating the DC component value for the plurality of data points comprises calculating:

$$DC = \frac{\sum_{i=1}^{n} x_i w_i}{n \cdot \text{Mean\_Value\_Of\_Window}};$$

wherein n is the number of data points in one or more buffers storing the first subset;
wherein the Mean_Value_Of_Window is a mean value of the window data.

36. The method of claim 21,
wherein said calculating the DC component value comprises using one of one or more DC noise rejection settings, wherein each one of the one or more DC noise rejection settings corresponds to a certain frequency for noise rejection.

37. A method for calculating an RMS value of a signal, the method comprising:
receiving data from an analog-to-digital converter, wherein the analog-to-digital converter is comprised in a measurement system;
calculating one or more interpolated window points from window data, wherein the window data comprises data for a window;
calculating intermediate results using the one or more interpolated window points and data points from the analog-to-digital converter; wherein one or more interpolated window data points are substantially aligned with data points from the analog-to-digital converter; and
calculating RMS value for the data from the analog-to-digital converter using intermediate results.

38. The method of claim 37, wherein said calculating the one or more interpolated window point is performed in real-time.

39. The method of claim 37, further comprising:
filtering the analog-to-digital converter data using a digital filter prior to said calculating the one or more interpolated window point.

40. The method of claim 39, further comprising:
converting analog-to-digital converter data from a fixed point format to a floating point format prior to said filtering analog-to-digital converter data using the digital filter; and
converting analog-to-digital converter data from the floating point format back to the fixed point format after said filtering analog-to-digital converter data using the digital filter and prior to converting one or more interpolated window data points to the fixed point format.

41. The method of claim 37,
wherein said calculating the RMS value for the data from the analog-to-digital converter comprises calculating AC RMS value for the data from the analog-to-digital converter;
wherein said calculating the AC RMS value for the data from the analog-to-digital converter comprises calculating one or more of DC component value for the data from the analog-to-digital converter and total RMS value for the data from the analog-to-digital converter;
wherein said calculating the AC RMS value for the data from the analog-to-digital converter further comprises using the DC component value for the data from the analog-to-digital converter and the total RMS value for the data from the analog-to-digital converter.

42. The method of claim 37,
wherein said calculating the one or more interpolated window point comprises interpolating the one or more interpolated window point from window data, wherein the window comprises one or more of:
a rectangular window;
a Bartlett window;
a Hanning window;
a Hamming window;
a Kaiser-Bessel window; and
any other window.

43. The method of claim 42,
wherein the window is independent of $sinc^N$ windows.

44. The method of claim 37,
wherein said calculating the intermediate results using the one or more interpolated window points and the data points from the analog-to-digital converter comprises calculating:

$\Sigma x_i w_i$; and $\Sigma x_i^2 w_i$ wherein $x_i$ is an $i^{th}$ data point; and
wherein $w_i$ is an $i^{th}$ interpolated window point.

45. The method of claim 44,
wherein said calculating $\Sigma x_i w_i$ comprises calculating:

$(\Sigma x_i w_i)_{new} = (\Sigma x_i w_i)_{old} + x_n \cdot w_n$;

wherein $(\Sigma x_i w_i)$ comprises a previous calculation for a previous data point and $x_n \cdot w_n$ comprises a current interpolated window point and a current data point.

46. The method of claim 44,
wherein said calculating $\Sigma x_i^2 w_i$ comprises calculating:

$(\Sigma x_i^2 w_i)_{new} = (\Sigma x_i^2 w_i)_{old} + x_n^2 \cdot w_n$;

wherein $(\Sigma x_i^2 w_i)_{old}$ comprises a previous calculation for a previous data point and $x_n^2 \cdot w_n$ comprises a current interpolated window point and a current data point.

47. The method of claim 44,
wherein said calculating the RMS value comprises calculating:

$$DC = \frac{\frac{\sum_{i=1}^{n} x_i w_i}{n}}{\text{Mean\_Value\_Of\_Window}}; \text{ and}$$

$$AC = \sqrt{\frac{\frac{\sum_{i=1}^{n} x_i^2 w_i}{n}}{\text{Mean\_Value\_Of\_Window}} - DC^2};$$

wherein n is the number of data points in one or more buffers;
wherein the Mean\_Value\_Of\_Window is a mean value of data points in a window.

* * * * *

UNITED STATES PATENT AND TRADEMARK OFFICE
CERTIFICATE OF CORRECTION

| | | |
|---|---|---|
| PATENT NO. | : 7,016,796 B2 | |
| APPLICATION NO. | : 10/452743 | |
| DATED | : March 21, 2006 | |
| INVENTOR(S) | : Bakul Damle, Christopher G. Regier and Scott Borisch | |

It is certified that error appears in the above-identified patent and that said Letters Patent is hereby corrected as shown below:

In the Claims:

Column 16
Line 19, please delete "wherein the window data comprises data for a window,".

Column 17
Line 17, please delete "converter; wherein the" and substitute -- converter, wherein the --;

Line 22, please delete "using intermediate results." and substitute -- using the intermediate results. --;

Line 23, please delete " window point is performed" and substitute -- window points is performed --;

Line 28, please delete "interpolated window point." and substitute -- interpolated window points. --;

Line 57, please delete "window point comprises" and substitute -- window points comprises --.

UNITED STATES PATENT AND TRADEMARK OFFICE
CERTIFICATE OF CORRECTION

PATENT NO. : 7,016,796 B2
APPLICATION NO. : 10/452743
DATED : March 21, 2006
INVENTOR(S) : Bakul Damle, Christopher G. Regier and Scott Borisch It is certified that error appears in the above-identified patent and that said Letters Patent is hereby corrected as shown below:

Column 18
Line 26, please delete "wherein $\left(\sum x_i w_i\right)$ comprises" and substitute -- wherein $\left(\sum x_i w_i\right)_{old}$ comprises --;

Line 31, please delete " $\left(\sum x_i^2 w_i\right)_{old} x_n^2 \cdot w_n$ " and substitute -- $\left(\sum x_i^2 w_i\right)_{old} + x_n^2 \cdot w_n$ --.

Signed and Sealed this

Seventeenth Day of October, 2006

JON W. DUDAS
*Director of the United States Patent and Trademark Office*